(12) United States Patent
Ishii

(10) Patent No.: US 7,564,535 B2
(45) Date of Patent: Jul. 21, 2009

(54) SEAMLESS EXPOSURE WITH PROJECTION SYSTEM COMPRISES ARRAY OF MICROMIRRORS WITH PREDEFINED REFLECTIVITY VARIATIONS

(76) Inventor: Fusao Ishii, 350 Sharon Park Dr., G26, Menlo Park, CA (US) 94025

( * ) Notice: Subject to any disclaimer, the term of this patent is extended or adjusted under 35 U.S.C. 154(b) by 431 days.

(21) Appl. No.: 11/294,931

(22) Filed: Dec. 5, 2005

(65) Prior Publication Data
US 2007/0127109 A1    Jun. 7, 2007

(51) Int. Cl.
*G03B 27/54* (2006.01)
*G02B 26/00* (2006.01)

(52) U.S. Cl. .............................. 355/67; 355/55; 355/72; 355/75; 355/77; 355/69; 355/30; 359/290; 359/292; 359/295; 359/298; 359/224; 359/855; 347/233; 347/239; 347/241; 347/243; 347/255; 347/256; 347/260; 430/5; 430/311; 716/21

(58) Field of Classification Search ................... 355/53, 355/67, 72, 75, 77, 69, 30; 359/290–292, 359/295, 298, 223, 224, 855; 347/233, 239, 347/241, 243, 255, 256, 260; 430/5, 311; 716/21

See application file for complete search history.

(56) References Cited

U.S. PATENT DOCUMENTS

| 6,238,852 B1 | 5/2001 | Klosner et al. |
| 6,304,316 B1 | 10/2001 | Jain et al. |
| 6,312,134 B1 * | 11/2001 | Jain et al. .................... 359/855 |
| 6,379,867 B1 | 4/2002 | Mei et al. |

* cited by examiner

*Primary Examiner*—Evelyn A. Lester
(74) *Attorney, Agent, or Firm*—Bo-In Lin

(57) ABSTRACT

A lithographic scanning apparatus includes a light projection device for seamlessly and uniformly projecting a scanning light onto a light exposing area. The light projecting device further includes an array of micromirrors having a predefined distribution pattern of reflectance variations for reflecting an incident light onto the light exposing area to seamlessly and uniformly scanning a reflecting light over the light exposing area. In one of a lithographic scanning apparatus, the micromirrors of the micromirror array are coated with a reflective coating of different reflectance to provide the predefined distribution pattern of reflectance variations. In another lithographic scanning apparatus, the micromirrors of the micromirror array are coated with stripes of reduced reflectance whereby each micromirror may have predefined total reflectance to provide the predefined distribution pattern of reflectance variations.

42 Claims, 6 Drawing Sheets

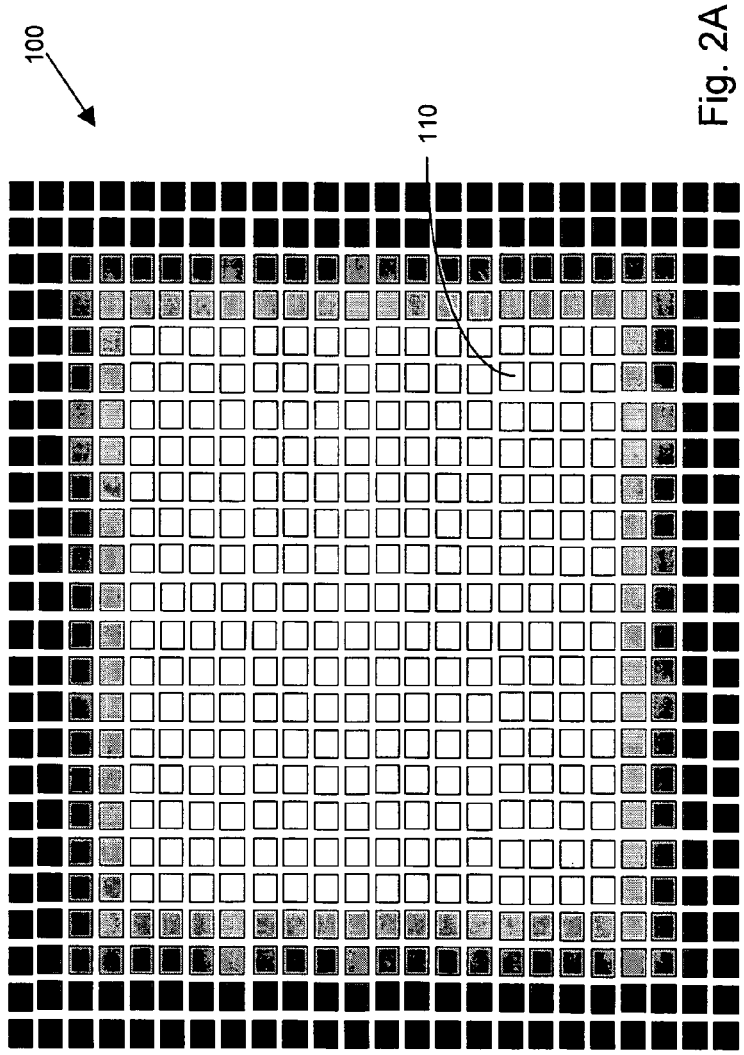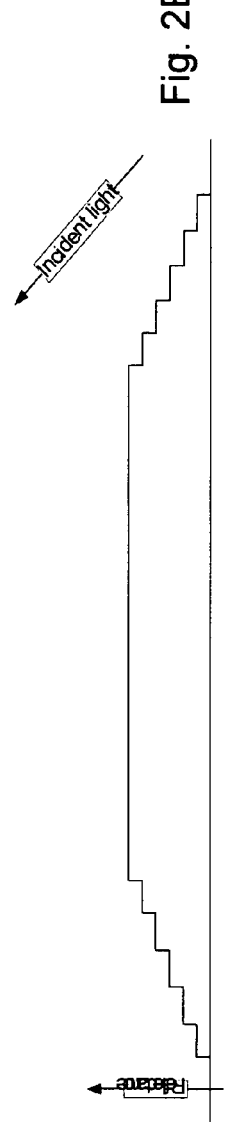
Fig. 2A
Fig. 2B

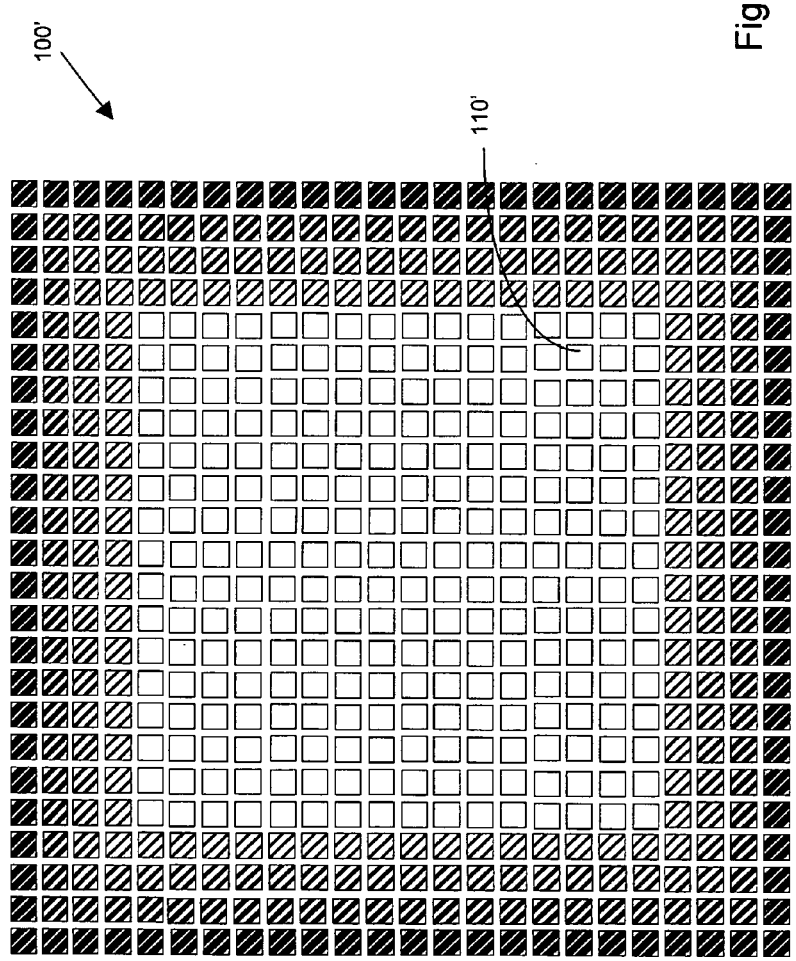
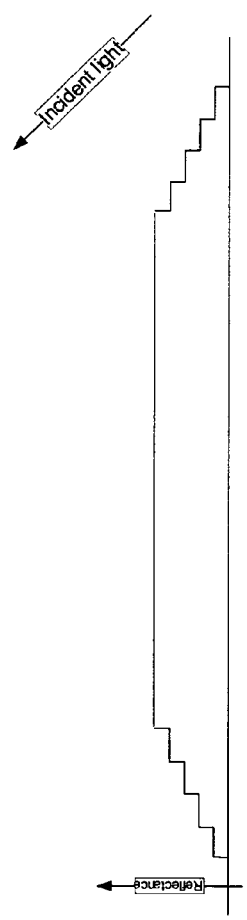
Fig. 3A
Fig. 3B

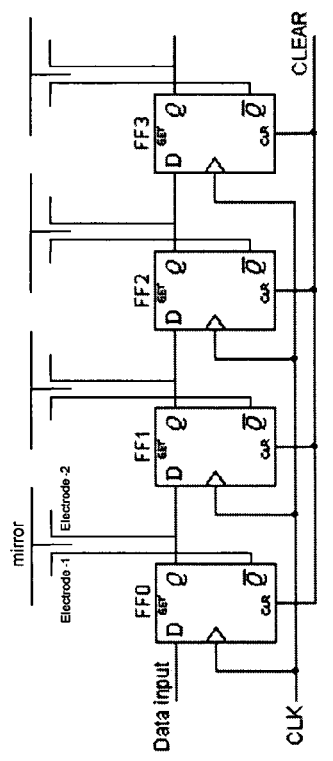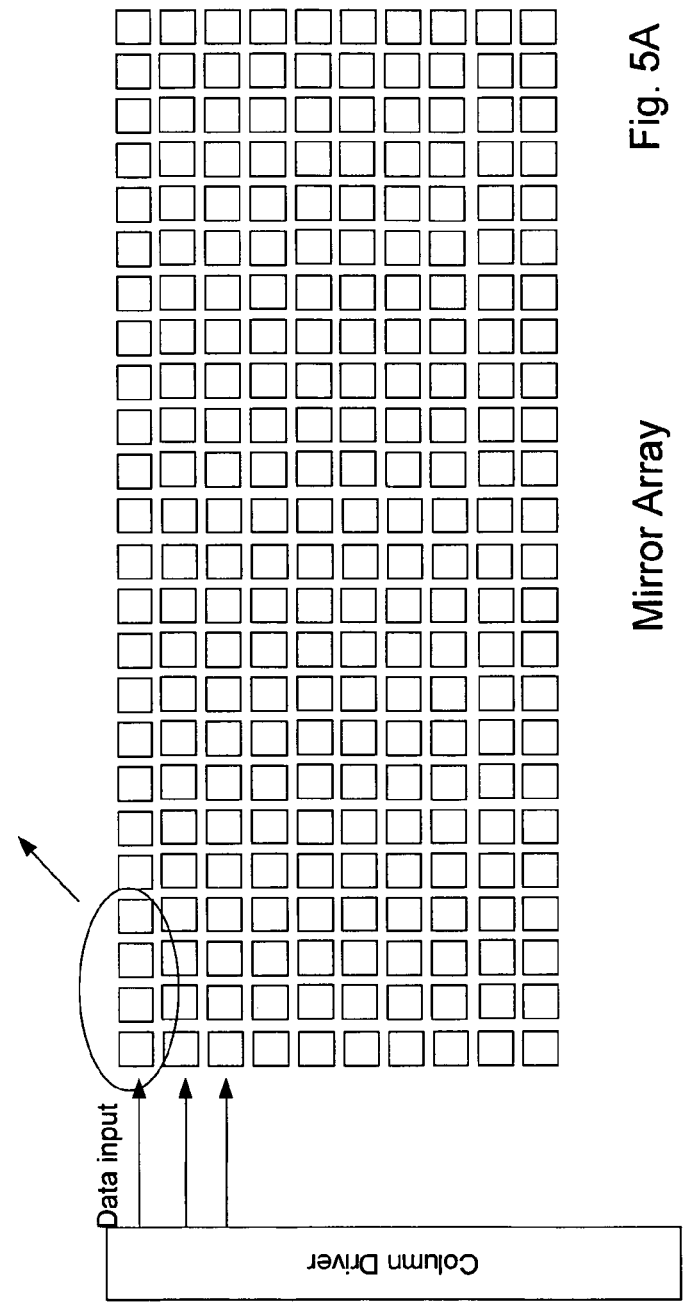
Fig. 5A
Fig. 5B
Embodiment of shift register

SEAMLESS EXPOSURE WITH PROJECTION SYSTEM COMPRISES ARRAY OF MICROMIRRORS WITH PREDEFINED REFLECTIVITY VARIATIONS

TECHNICAL FIELD

This invention relates to systems and methods for applying optical projection to scan a light over an exposure surface. More particularly, this invention relates to a projecting and scanning system for scanning a seamless light projection over a surface for applications in lithographic equipment for semiconductor or other electronic manufactures.

BACKGROUND ART

Even though the conventional technologies of optical lithography are currently most widely employed for high-volume production of microelectronic components and can provide great advantages because the high throughput achieved through the parallel processes of nature pattern generation, however, the lithographic technologies still have several limitations and drawbacks. In order to overcome such limitations and drawbacks, various maskless lithographic technologies have been explored and disclosed. Particularly, as will be further discussed below, various patented inventions have been attempted to improve the efficiency and performances of the markless lithographic technologies.

However, such technologies still have difficulties that the conventional systems are limited to either horizontal or vertical overlapping of scanning exposures but not two-dimensional exposure overlaps while maintaining seamless exposure patterns. Stringent moving direction control with tight limitations of tolerance must be maintained because such single direction overlapping limitations. Furthermore, as technologies progress, there are greater demands of higher resolution control to achieve higher level of uniformity of exposures. Conventional technologies applying spatial light modulation (SLM) have difficulties in satisfying these requirements, especially those SLM that implemented with micromirrors due to the limited degree of controllability of light reflected from each micromirror. Additionally, the throughput of the lithographic operations are limited as higher rate speed of data transmission is required to adjust the lithographic exposures and conventional technologies usually do not have sufficient data transfer rates to satisfy these requirements. Last but not least, the level of contrast for exposures as that provided by conventional technologies are still limited that further limit the quality and performance and quality of semiconductor manufacturing processes to produce integrated circuits with ultra-high cell density with precise controlled critical dimensions while maintaining very tight misalignment tolerances.

Varieties of factors still exist in the lithographic technologies that can significantly reduce the manufacturing speed and efficiency. Specifically, the speed of a single exposure is often determined by the intensity of the illumination and the sensitivity of the resist. Efforts are devoted to improve the exposure speed by increasing the illumination intensity and/or the resist sensitivity. However, for circuits especially those with many layers of feature, require many individual exposures. Operations to switch the masks between exposures often cost a significant amount of overhead in manufacturing throughput. Furthermore, a mask has to be accurately placed to satisfy the alignment requirements. Throughput is further reduced through such operations. Production costs are further increased due to the requirement that a fabrication facility of microelectronic components often has to have an inventory of different masks to generate wide varieties of patterns. The inventory further increases the overhead of manufacturing the integrated circuits and the costs and time are further added by processes and time required to order such masks.

In addition to above factors, the demand for developing maskless lithography is further increased as the cost the mask is tremendously increased with increase of size and reduced pitch between the microelectronic structural features. Meanwhile, the increased integrations of functions and the miniaturization of electronic devices, further push these trends to produce masks with larger areas with small pattern pitches that lead to very expensive masks required for electronic device manufactures. For these reasons, it would be of great value to provide maskless lithographic technologies to overcome these limitations and difficulties.

Several recent patented disclosures are made in the field of maskless lithography that include U.S. Pat. No. 6,238,852 that discloses the applications of light projected to two directions so that two substrates can be exposed simultaneously. The lithography process is performed by a maskless lithography system that provides large-area, seamless patterning using a reflective spatial light modulator such as a Deformable Micromirror Device (DMD) directly addressed by a control system so as to provide a first pattern, via a first projection subsystem, on a first photoresist-coated substrate panel, while simultaneously providing a duplicate pattern, which is a negative of the pattern on the first substrate panel, via a second projection subsystem, onto a second photosensitive substrate panel, thus using the normally-rejected non-pattern "off" pixel radiation reflected by the "off" pixel micromirrors of the DMD, to pattern a second substrate panel. Since the "off" pixel reflections create a pattern which is complementary to the "on" pixel pattern, using a complementary photoresist coating on the second substrate panel provides for a duplicate pattern, as is usually desired. Since both the "on" and "off" reflections are used from each pixel position, using the same selection, the result is the doubling of throughput.

Another maskless lithographic system is disclosed in U.S. Pat. No. 6,379,867, a photolithography system and method for providing a mask image to a subject such as a wafer is provided. The mask images are divided into sub-patterns and sequentially provided to a pixel panel, such as a deformable mirror device or a liquid crystal display. The pixel panel converts each sub-pattern into a plurality of pixel elements. Each of the pixel elements is then simultaneously focused to discrete, non-contiguous portions of the subject through a microlense array. The subject and pixel elements are then moved (e.g., one or both may be moved) and the next sub-pattern in the sequence is provided to the pixel panel. As a result, light can be projected on the subject, according to the pixel elements, to create a contiguous image on the subject.

U.S. Pat. No. 6,304,316 further discloses a projection microlithography system that can pattern very large, curved substrates at very high exposure speeds and any desired image resolution, the substrates being permitted to have arbitrary curvature in two dimensions. The substrate is held rigidly on a scanning stage, on which is also mounted a mask containing the pattern to be formed on the substrate. The mask is imaged on the substrate by a projection subsystem, which is stationary and situated above the scanning stage. The mask is illuminated with a polygonal illumination beam which causes a patterned region of similar shape to be imaged on the substrate. Different regions of the substrate are moved in a direction parallel to the direction of the optical axis at the substrate (z-axis) by suitable amounts to keep the segment being exposed within the depth of focus of the imaging lens. The stage is programmed to scan the mask and substrate simultaneously across the polygonal regions so as to pattern the whole mask. Suitable overlap between the complementary intensity profiles produced by the polygonal illumination configuration ensures seamless joining of the scans. This microlithography system includes optomechanical mechanisms for dynamically sensing the substrate height at each point, for moving the substrate in the z-dimension, and/or configuring the focal plane of the projection subsystem so as to always keep the substrate region being exposed within the depth of focus of the projection subsystem.

However, these patented inventions do not provide an effective solutions to the above discussed problems and limitations. Therefore, a need still exists in the art of microlithography systems and methods to provide new and improved maskless lithographic systems and processes including those applications to the lithographic equipment for semiconductor manufacturing to provide new and improved methods and systems such that the above-discussed difficulties can be resolved.

SUMMARY OF THE INVENTION

It is an aspect of the present invention that a maskless lithographic system is provided that includes an array of micromirrors wherein each micromirror is coated to have a predefined reflectivity and by arranging the micromirror reflectivity variations and distributions, seamless exposures that can be freely moved in the horizontal and vertical direction are achievable. The above discussed difficulties and problems are resolved.

In another aspect, the present invention provides a maskless lithographic system that includes an array of micromirrors wherein each micromirror is coated to have a predefined reflectivity and by arranging the micromirror reflectivity variations and distributions, seamless exposures with precisely controllable reflectivity for each micromirror is achievable thus provide a solution to the problems encountered in the prior art technologies.

In yet another aspect, the present invention provides a maskless lithographic system that includes an array of micromirrors wherein each micromirror is coated to have a predefined reflectivity and by arranging the micromirror reflectivity variations and distributions, seamless exposures with higher contrast in the exposure are achieved because of the directions of the patterns that can be arranged to avoid the Frounhoufer detraction.

In yet another aspect, the present invention provides a maskless lithographic system that includes an array of micromirrors wherein each micromirror is coated to have a predefined reflectivity and by arranging the micromirror reflectivity variations and distributions, seamless exposures with greater tolerance of the horizontal and vertical movements are allowable because the horizontal and vertical overlaps are allowed with gray scales arrangements for uniform exposures prearranged in both the horizontal and vertical directions.

In yet another aspect, the present invention provides a maskless lithographic system that includes an array of micromirrors wherein the faster data transfer rate is achieved because of the parallel shift registers are arranged such that higher lithographic operation throughput can be achieve.

These and other objects and advantages of the present invention will no doubt become obvious to those of ordinary skill in the art after having read the following detailed description of the preferred embodiment, which is illustrated in the various drawing figures.

BRIEF DESCRIPTION OF FIGURES

The present invention is described in detail below with reference to the following Figures.

FIGS. 2A and 3A are two top view of a micromirror array with variable reflectance to process seamless lithographic exposures during the scanning processes.

FIGS. 2B and 3B are two diagram to show the variations of the micromirror reflectance according to different locations each micromirror is located in the micromirror arrays.

FIG. 5A shows a column or row driver to provide micromirror driving data for each column or row of micromirrors.

FIG. 5B is a circuit diagram for showing the shift register array implemented in the column or row drivers for buffering and transmitting driving signals to the micromirror array to move one column or one row of micromirrors.

DESCRIPTIN OF PREFERRED EMBODIMENTS

Figure 1:
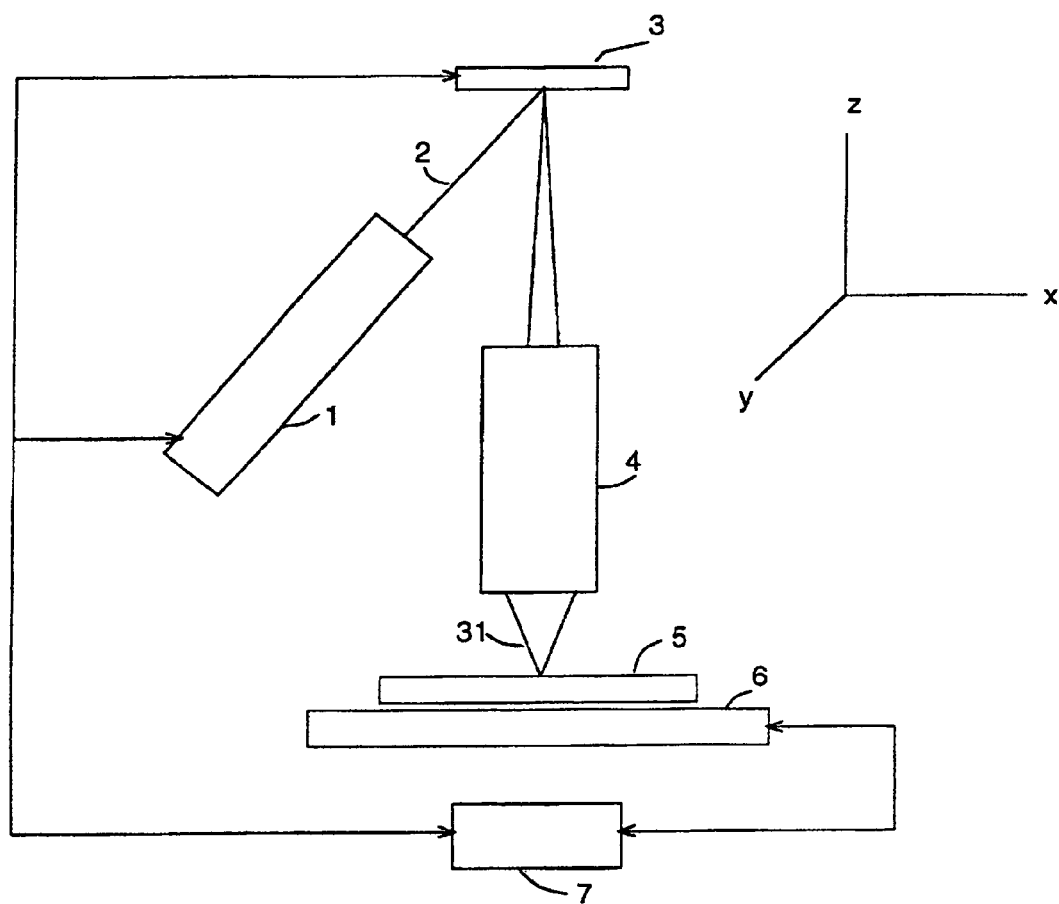
FIG. 1 is a functional block diagram for showing a maskless photolithographic system utilizing a deflectable micromirror array (DMD) to obtain controllable lithographic images without requiring masks.

Referring to FIG. 1 for a schematic diagram for showing a maskless lithography system implemented with a new micromirror array of this invention. The light source 1 irradiates a light beam 2 as an illumination for exposure. The output beam 2 is projected onto a spatial light modulator (SLM) that is a micromirror array 3 as will be further discussed in FIG. 2 below. The micromirror array 3 is formed on a microchip controllable by an electronic logic and memory circuits (not shown). These micromirror lenses may have an option to tilt in different directions for selective reflection of deflection of individual pixels. The projection lens 4 then images the light reflected from the micromirrors 3 onto a substrate 5 supported on a scanning stage 6. The projection lens may have different reduction ratio depending on the resolution of the pixel to reduce the reflected light from the micromirrors 3 onto the substrate 5 to carry out the maskless lithographic scanning operation. A control system 7 controls the scanning stage 6, the light source 1 and the micromirror array 3 to coordinate the movement of the scanning stage 6, the light intensity projected from the light source 1 and the reflections from different micromirrors from the micromirror array 3.

FIG. 2A is a top view of a micromirror array 100 implemented as the micromirror array 3 of FIG. 1. The micromirror array 100 includes a plurality micromirrors 110. For the purpose of providing seamless scanning, each micromirror 110 is formed with predefined reflectance. In order to carry out a seamless scanning, the reflectance for each micromirror is formed according to a pattern as that shown in FIG. 2B. The reflectance of the micromirror is gradually increased from the edge to the center.

FIG. 3A is a top view of another micromirror array 100' as an alternate embodiment of this invention to implement as the micromirror array 3 of FIG. 1. The micromirror array 100' includes a plurality micromirrors 110'. Each of the micromirrors are coated with stripes to generate a gradually increased reflectance from the edge to the center as that shown in FIG. 3B.

Figure 4B:
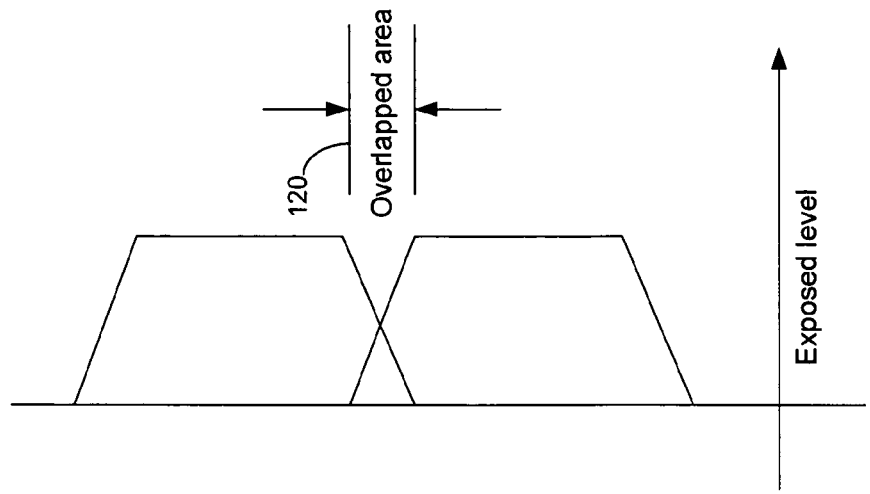
FIG. 4B shows the uniformity of exposures when there are overlapping areas during the scanning process as the light beams are moving seamlessly across the scanning surface.
Figure 4A:
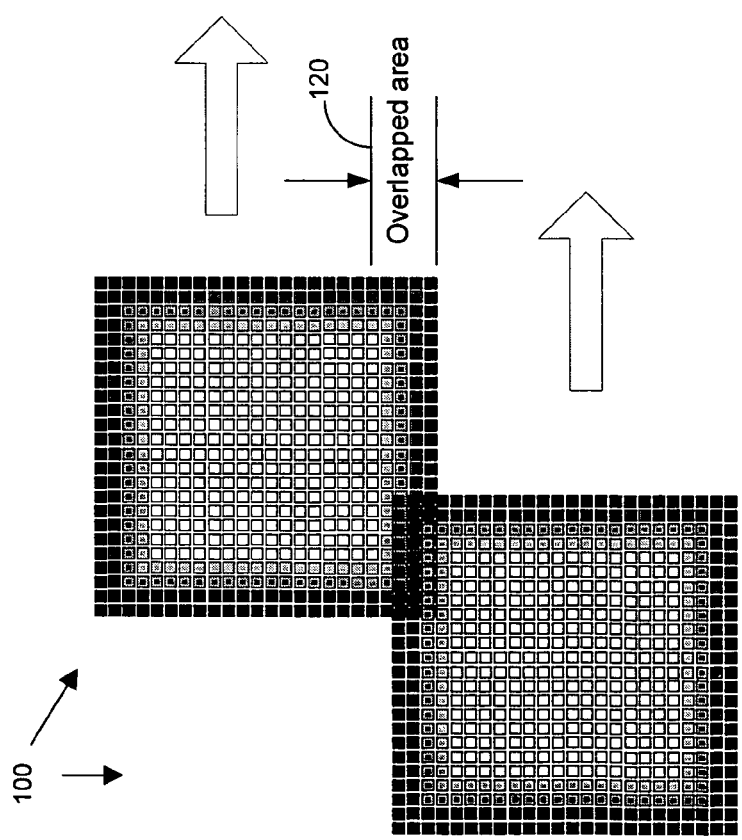
FIG. 4A shows the flexibility of moving the micromirror array in two dimensions during a lithographic scanning process.

FIG. 4A shows the movement of the micromirror array 100 or 100' implemented as the spatial light modulator (SLM) 3 of FIG. 1, as the light reflection areas moving along a vertical direction during a scanning process. In the scanning process, there is an overlapping area 120 in order to prevent a gap between the scanned areas such that a seamless scan process is achieved. However, it is also required that the overlapped area have the same exposure intensity as the non-overlapping areas. FIG. 4B is a diagram for illustrating the exposure intensity of the overlapped area 120 is the same as the non-overlapped area because the predefined reflectance pattern that the pattern has a gradually increased reflectance from the edge toward the center of the micromirror array. As shown in FIG. 4B, the overlapped areas 120 has a light exposure same as the non-overlapped area. Therefore, a seamless exposure by applying the micromirror array 100 or 100' is achieved and a uniform exposure across the scanned areas can be achieved with gradually increased reflectance of the micromirrors as that shown in FIGS. 3A and 3B.

FIG. 5A shows a column driver 200 for controlling either a column or a row of micromirrors 110 (or 110'). The current technologies are still not able to manage to dimensional control of micromirrors yet. For an exposure system operate with 250 Khz requires a display of one image picture in four microseconds. Each picture of image includes approximately one-hundred thousand pixels. A system with a data transfer rate of twenty-five Giga-bits per second (25 Gbps) is required. Current technologies are still not able to transfer such data transfer rates in order to achieve two dimensional micromirror controls. In one embodiment, a column or row of data is transmitted to the micromirror array to adjust the direction of each micromirror 110 (or 110'). FIG. 5B shows an exemplary circuit to implement the shift registers. With a row or column of shift register to control multiple micromirrors in parallel, faster data transfer rate is achieved. The parallel shift registers as shown in FIG. 5B received data from a personal computer (PC) or any process controller to control a column or a row of micromirrors such that higher lithographic operation throughput can be achieve.

The seamless exposure system can also be further applied to project onto a deformable surface such as a flexible deformable substrate. The micromirror array of this invention can be flexibly adjust in real time responding to the deformation of the projected surface measured in real time to project uniform exposures onto the deformed surface. Therefore, this invention further discloses a light projection device for seamlessly and uniformly exposing a surface of a deformable substrate that includes an array of micromirrors with predefined distribution pattern of reflectance variations for reflecting an incident light onto the deformable substrate with each micromirror of the micromirror array flexibly adjusted according to a deformation measurement.

Figure 6:
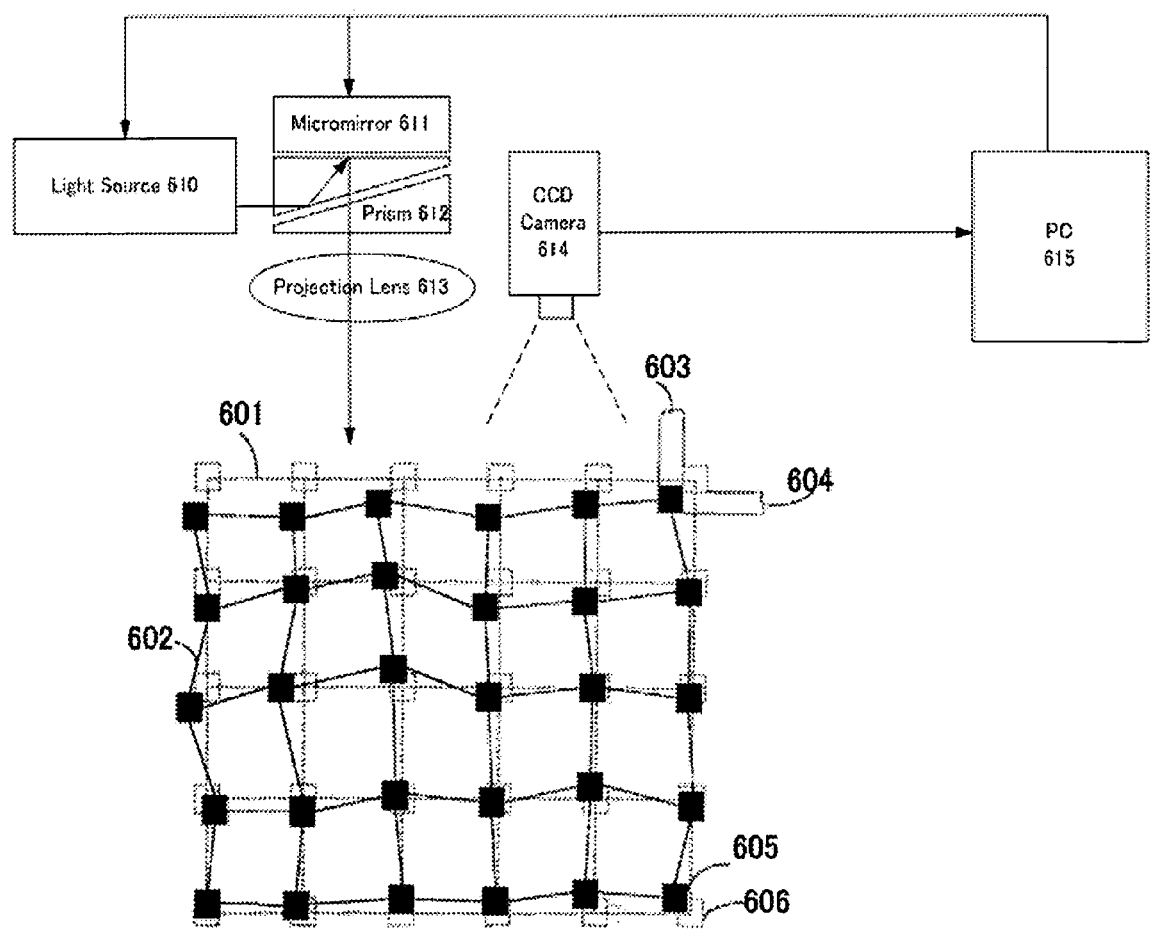
FIG. 6 is a schematic diagram for showing an optical meansurement device as an exemplary embodiment implemented with the charge coupled device (CCD) camera.

The substrate in FIG. 6 is exposed with the pattern of 601 to create the first patterned layer, but the actual pattern of the first layer measured with the CCD camera, 614, indicates the pattern of 602. The difference between 601 and 602 is due to the deformation of substrate. When the second layer is exposed over the first patterned layer, the mismatch between the first and second layers, often referred to as overlay accuracy, is very critical for multi-layer electronics such as PC board and semiconductor fabrication. To minimize or eliminate this mismatch requires the modification of the pattern of the second layer, so that the patterns on the second layer match the patterns on the first layer. This invention proposes that the pattern of the fabricated layer is measured by a vision camera, such as CCD image sensor 614, and said measured image is compared with the design pattern 601 by a computer 615. The difference between said measured pattern and said design pattern is calculated by the computer 615. X-direction mismatch at the right-top corner is shown at 603 and Y-directional mismatch is shown as 604. Then the designed pattern is modified so that said modified designed pattern will match said fabricated pattern and the mismatch can be avoided. Said modified design pattern is sent to the micromirror and the light source to expose said substrate over said fabricated layer. The image created by said micromirror is projected through the prism 612 and the projection lens 613 onto said substrate.

Therefore, in a preferred embodiment, the seamless exposure system as disclosed can be implemented in a system to develop patterns to form a plurality of electronic elements on a deformable substrate. The system includes an optical measurement device to optically measure an existing geometric pattern on a substrate. The existing pattern has been written onto an existing layer of the substrate. A computing device, coupled to the optical measurement device, calculates a correction between the existing geometric pattern and an expected pattern of the nth layer. An image transformation component, coupled to the computing device, performs an image transformation on an electronic pattern to be used in an overlying layer to be formed on top of the existing layer, based on the calculated correction, to generate a corrected electronic pattern. A writing component, coupled to the image transformation component, writes the corrected electronic pattern onto the overlying layer using the micromirror array as a digital mask system. The writing component contains a radiation source, which is coupled to an optical system for guiding radiation from the radiation source to the micromirror lens array as the programmable digital mask to form the electronic elements on the deformable substrate.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A light projection device for seamlessly and uniformly exposing a light exposing area comprising:

an array of micromirrors having a predefined distribution pattern of reflectance variations for reflecting an incident light onto said light exposing area to seamlessly and uniformly project a reflecting light scanning over said light exposing area; and each of said micromirrors of said micromirror array is coated with stripes of reduced reflectance to have a predefined total reflectance according to said predefined distribution pattern of reflectance variations.

2. The light projection device of claim 1 wherein:

said micromirrors of said micromirror array coated with said stripes of reduced reflectance according to said predefined distribution pattern of reflectance variations depending on a relative location of each of said micromirrors in said micromirror array.

3. The light projection device of claim 1 wherein:

said micromirrors of said micromirror array coated with said stripes of reduced reflectance to have said predefined total reflectance according to said predefined distribution pattern of reflectance variations with gradually increasing reflectance from an edge of said micromirror array toward a central portion of said micromirror array.

4. The light projection device of claim 1 wherein:

said micromirrors of said micromirror array coated with said stripes of reduced reflectance according to said predefined distribution pattern of reflectance variations wherein said micromirror array constituting substantially a polygon shaped array and said pattern of reflectance variations constituting substantially a gradually increasing reflectance from edges of said polygon shaped array toward a central portion of said micromirror array.

5. The light projection device of claim 1 wherein:
said micromirrors of said micromirror array are coated with said stripes of reduced reflectance according to said predefined distribution pattern of reflectance variations with reduced reflectance in a peripheral areas for allowing overlapping exposures of said reflecting light from micromirrors of said reduced reflectance.

6. The light projection device of claim 1 further comprising:
a micromirror controller for controlling each of said micromirrors for performing a maskless lithographic light projection.

7. The light projection device of claim 1 further comprising:
a micromirror controller for controlling each of said micromirrors according to a deformation measurement of said light exposure area supported on a deformable substrate for performing a maskless lithographic exposure on said deformable substrate.

8. A light projection device comprising:
an array of micromirrors having a predefined distribution pattern of reflectance variations for reflecting an incident light onto said light exposing area to seamlessly and uniformly project a reflecting light scanning over said light exposing area; and
said micromirrors of said micromirror array coated with a reflective coating of different reflectance according to a predefined distribution pattern of reflectance variations wherein said micromirror array constituting substantially a polygon shaped array and said pattern of reflectance variations constituting substantially a gradually increasing reflectance from edges of said polygon shaped array toward a central portion of said micromirror array.

9. A light projection device comprising:
an array of micromirrors having a predefined distribution pattern of reflectance variations for reflecting an incident light onto said light exposing area to seamlessly and uniformly project a reflecting light scanning over said light exposing area; and
said micromirrors of said micromirror array are coated with a reflective coating of different reflectance according to said predefined total reflectance to provide said predefined distribution pattern of reflectance variations with reduced reflectance in a peripheral areas for allowing overlapping exposures of said reflecting light from micromirrors of said reduced reflectance and gradually increasing reflectance from said peripheral area of said micromirror array toward a central portion of said micromirror array.

10. A lithographic scanning apparatus comprising:
a light projection device for seamlessly and uniformly projecting a scanning light onto a light exposing area;
said light projecting device further includes an array of micromirrors having a predefined distribution pattern of reflectance variations for reflecting an incident light onto said light exposing area to seamlessly and uniformly scan a reflecting light over said light exposing area; and
each of said micromirrors of said micromirror array is coated with stripes of reduced reflectance to have a predefined total reflectance according to said predefined distribution pattern of reflectance variations.

11. The lithographic scanning apparatus of claim 10 wherein:
said micromirrors of said micromirror array coated with said stripes of different reduced reflectances to provide said predefined distribution pattern of reflectance variations.

12. The lithographic scanning apparatus of claim 10 wherein:
said micromirrors of said micromirror array coated with said stripes of reduced reflectance to have a predefined total reflectance according to said predefined distribution pattern of reflectance variations with gradually increasing reflectance from an edge of said micromirror array toward a central portion of said micromirror array.

13. The lithographic scanning apparatus of claim 10 wherein:
said micromirrors of said micromirror array coated with said stripes of reduced reflectance to have a predefined total reflectance according to said predefined distribution pattern of reflectance variations wherein said micromirror array constituting substantially a polygon shaped array and said pattern of reflectance variations constituting substantially a gradually increasing reflectance from edges of said polygon shaped array toward a central portion of said micromirror array.

14. The lithographic scanning apparatus of claim 10 wherein:
said micromirrors of said micromirror array coated with said stripes of reduced reflectance to have a predefined total reflectance according to said predefined distribution pattern of reflectance variations with reduced reflectance in a peripheral areas for allowing overlapping exposures of said reflecting light from micromirrors of said reduced reflectance and gradually increasing reflectance from said peripheral area of said micromirror array toward a central portion of said micromirror array.

15. The lithographic scanning apparatus of claim 10 further comprising:
a micromirror controller for controlling each of said micromirrors for performing a maskless lithographic light projection.

16. The lithographic scanning apparatus of claim 10 further comprising:
a micromirror controller for controlling each of said micromirrors according to a deformation measurement of said light exposure area supported on a deformable substrate for performing a maskless lithographic exposure on said deformable substrate.

17. A lithographic scanning apparatus comprising:
a light projection device for seamlessly and uniformly projecting a scanning light onto a light exposing area;
said light projecting device further includes an array of micromirrors having a predefined distribution pattern of reflectance variations for reflecting an incident light onto said light exposing area to seamlessly and uniformly scan a reflecting light over said light exposing area; and
said micromirrors of said micromirror array are coated with a reflective coating of different reflectance according to said predefined distribution pattern of reflectance variations with gradually increasing reflectance from an edge of said micromirror array toward a central portion of said micromirror array.

18. A lithographic scanning apparatus comprising:
a light projection device for seamlessly and uniformly projecting a scanning light onto a light exposing area;

said light projecting device further includes an array of micromirrors having a predefined distribution pattern of reflectance variations for reflecting an incident light onto said light exposing area to seamlessly and uniformly scan a reflecting light over said light exposing area; and said micromirrors of said micromirror array are coated with a reflective coating of different reflectance according to said predefined distribution pattern of reflectance variations wherein said micromirror array constituting substantially a polygon shaped array and said pattern of reflectance variations constituting substantially a gradually increasing reflectance from edges of said polygon shaped array toward a central portion of said micromirror array.

19. A lithographic scanning apparatus comprising:

a light projection device for seamlessly and uniformly projecting a scanning light onto a light exposing area;

said light projecting device further includes an array of micromirrors having a predefined distribution pattern of reflectance variations for reflecting an incident light onto said light exposing area to seamlessly and uniformly scan a reflecting light over said light exposing area; and said micromirrors of said micromirror array are coated with a reflective coating of different reflectance according to said predefined distribution pattern of reflectance variations with reduced reflectance in a peripheral areas for allowing overlapping exposures of said reflecting light from micromirrors of said reduced reflectance and gradually increasing reflectance from said peripheral area of said micromirror array toward a central portion of said micromirror array.

20. A lithographic scanning apparatus for seamlessly and uniformly exposing a surface of a deformable substrate further comprising:

an array of micromirrors with a predefined distribution pattern of reflectance variations for reflecting a scanning light onto the deformable substrate with each micromirror of the micromirror array flexibly adjusted according to a deformation measurement; and said micromirrors of said micromirror array are coated with stripes of reduced reflectance to have a predefined total reflectance according to said predefined distribution pattern of reflectance variations.

21. The lithographic scanning apparatus of claim 20 further comprising:

a light source for projecting said scanning light onto said surface of said deformable substrate.

22. The lithographic scanning apparatus of claim 20 wherein:

said micromirrors of said micromirror array are coated with said stripes of different reduced reflectances to provide said predefined distribution pattern of reflectance variations.

23. The lithographic scanning apparatus of claim 20 wherein:

said micromirrors of said micromirror array coated with said stripes of reduced reflectance to have predefined total reflectance according to said predefined distribution pattern of reflectance variations with gradually increasing reflectance from an edge of said micromirror array toward a central portion of said micromirror array.

24. The lithographic scanning apparatus of claim 20 wherein:

said micromirrors of said micromirror array coated with said stripes of reduced reflectance to have predefined total reflectance according to said predefined distribution pattern of reflectance variations wherein said micromirror array constituting substantially a polygon shaped array and said pattern of reflectance variations constituting substantially a gradually increasing reflectance from edges of said polygon shaped array toward a central portion of said micro mirror array.

25. The lithographic scanning apparatus of claim 20 wherein:

said micromirrors of said micromirror array coated with said stripes of reduced reflectance whereby said array of micromirrors have said predefined total reflectance to provide said predefined distribution pattern of reflectance variations with reduced reflectance in a peripheral areas for allowing overlapping exposures of said reflecting light from micromirrors of said reduced reflectance and gradually increasing reflectance from said peripheral area of said micromirror array toward a central portion of said micromirror array.

26. The lithographic scanning apparatus of claim 20 further comprising:

a micromirror controller for controlling each of said micromirrors for performing a maskless lithographic light projection.

27. The lithographic scanning apparatus of claim 20 further comprising:

an optical measurement device for optically measuring a pattern of existing electronic elements for determining said deformation measurement to flexibly adjust said array of micromirrors to carry out a lithographic scanning on said deformable substrate.

28. A lithographic scanning apparatus comprising:

an array of micromirrors with a predefined distribution pattern of reflectance variations for reflecting a scanning light onto the deformable substrate with each micromirror of the micromirror array flexibly adjusted according to a deformation measurement; and said micromirrors of said micromirror array are coated with a reflective coating of different reflectance to provide said predefined distribution pattern of reflectance variations with gradually increasing reflectance from an edge of said micromirror array toward a central portion of said micromirror array.

29. A lithographic scanning apparatus comprising:

an array of micromirrors with a predefined distribution pattern of reflectance variations for reflecting a scanning light onto the deformable substrate with each micromirror of the micromirror array flexibly adjusted according to a deformation measurement; and said micromirrors of said micromirror array are coated with a reflective coating of different reflectance to provide said predefined distribution pattern of reflectance variations wherein said micromirror array constituting substantially a polygon shaped array and said pattern of reflectance variations constituting substantially a gradually increasing reflectance from edges of said polygon shaped array toward a central portion of said micromirror array.

30. A lithographic scanning apparatus comprising:

an array of micromirrors with a predefined distribution pattern of reflectance variations for reflecting a scanning light onto the deformable substrate with each micromirror of the micromirror array flexibly adjusted according to a deformation measurement; and said micromirrors of said micromirror array are coated with a reflective coating of different reflectance to provide said predefined distribution pattern of reflectance variations with reduced reflectance in a peripheral areas for allowing overlapping exposures of said reflecting light from micromirrors of said reduced reflectance and gradually increasing reflectance from said peripheral area of said micromirror array toward a central portion of said micromirror array.

31. A method for carrying out a lithographic scanning comprising:
projecting a lithographic scanning light to an array of micromirrors having a predefined distribution pattern of reflectance variations for reflecting said lithographic scanning light onto a lithographic scanning area to seamlessly and uniformly scanning a reflecting light over said light exposing area; and
coating said micromirrors of said micromirror array with a reflective coating of different reflectance to provide said predefined distribution pattern of reflectance variations with gradually increasing reflectance from an edge of said micromirror array toward a central portion of said micromirror array.

32. The method of claim 31 further comprising:
coating said micromirrors of said micromirror array with said reflective coating of different reduced reflectances to provide said predefined distribution pattern of reflectance variations.

33. The method of claim 31 further comprising:
coating said micromirrors of said micromirror array with stripes of reduced reflectance to provide said predefined total reflectance according to said predefined distribution pattern of reflectance variations.

34. The method of claim 31 further comprising:
coating said micromirrors of said micromirror array with said stripes of reduced reflectance to provide said predefined total reflectance according to said predefined distribution pattern of reflectance variations with gradually increasing reflectance from an edge of said micromirror array toward a central portion of said micromirror array.

35. The method of claim 31 further comprising:
coating said micromirrors of said micromirror array with said stripes of reduced reflectance to provide said predefined total reflectance according to said predefined distribution pattern of reflectance variations wherein said micromirror array constituting substantially a polygon shaped array and said pattern of reflectance variations constituting substantially a gradually increasing reflectance from edges of said polygon shaped array toward a central portion of said micromirror array.

36. The method of claim 31 further comprising:
coating said micromirrors of said micromirror array with said stripes of reduced reflectance to provide said predefined total reflectance according to said predefined distribution pattern of reflectance variations with reduced reflectance in a peripheral areas for allowing overlapping exposures of said reflecting light from micromirrors of said reduced reflectance and gradually increasing reflectance from said peripheral area of said micromirror array toward a central portion of said micromirror array.

37. The method of claim 31 further comprising:
implementing a micromirror controller for controlling each of said micromirrors for performing a maskless lithographic light projection.

38. The method of claim 31 further comprising:
implementing a micromirror controller for controlling each of said micromirrors according to a deformation measurement of said light exposure area supported on a deformable substrate for performing a maskless lithographic exposure on said deformable substrate.

39. The method of claim 31 further comprising:
optically measuring a pattern of existing electronic elements for determining a deformation measurement to flexibly adjust said array of micromirrors to carry out a lithographic scanning on a deformable substrate.

40. The method of claim 31 further comprising:
optically measuring a pattern of existing electronic elements for determining a deformation measurement; and
implementing a micromirror controller for controlling each of said micromirrors to flexibly adjust said array of micromirrors according to said deformation measurement to carry out a maskless lithographic scanning on a deformable substrate.

41. A method for carrying out a lithographic scanning comprising:
projecting a lithographic scanning light to an array of micromirrors having a predefined distribution pattern of reflectance variations for reflecting said lithographic scanning light onto a lithographic scanning area to seamlessly and uniformly scanning a reflecting light over said light exposing area; and
coating said micromirrors of said micromirror array with a reflective coating of different reflectance to provide said predefined distribution pattern of reflectance variations with reduced reflectance in a peripheral areas for allowing overlapping exposures of said reflecting light from micromirrors of said reduced reflectance and gradually increasing reflectance from said peripheral area of said micromirror array toward a central portion of said micromirror array.

42. A method for carrying out a lithographic scanning comprising:
projecting a lithographic scanning light to an array of micromirrors having a predefined distribution pattern of reflectance variations for reflecting said lithographic scanning light onto a lithographic scanning area to seamlessly and uniformly scanning a reflecting light over said light exposing area; and
coating said micromirrors of said micromirror array with a reflective coating of different reflectance to provide said predefined distribution pattern of reflectance variations wherein said micromirror array constituting substantially a polygon shaped array and said pattern of reflectance variations constituting substantially a gradually increasing reflectance from edges of said polygon shaped array toward a central portion of said micromirror array.

\* \* \* \* \*